US012790547B2

(12) United States Patent
Lan et al.

(10) Patent No.: US 12,790,547 B2
(45) Date of Patent: Nov. 10, 2026

(54) DEVICE AND METHOD FOR PREPARING CARBON MATERIALS BY PYROLYSIS AND GRADED UTILIZATION OF BIOMASS

(71) Applicant: HENAN UNIVERSITY OF SCIENCE AND TECHNOLOGY, Luoyang (CN)

(72) Inventors: Weijuan Lan, Luoyang (CN); Xinxin Zhao, Luoyang (CN); Tingzhou Lei, Changzhou (CN); Xin Jin, Luoyang (CN); Liya Zhang, Zhengzhou (CN); Dongxue Yin, Luoyang (CN)

(73) Assignee: Henan University of Science and Technology, Luoyang (CN)

( * ) Notice: Subject to any disclaimer, the term of this patent is extended or adjusted under 35 U.S.C. 154(b) by 121 days.

(21) Appl. No.: 19/019,674

(22) Filed: Jan. 14, 2025

(65) Prior Publication Data

US 2025/0382525 A1 Dec. 18, 2025

Related U.S. Application Data

(63) Continuation of application No. PCT/CN2024/120662, filed on Sep. 24, 2024.

(30) Foreign Application Priority Data

Jun. 14, 2024 (CN) ........................ 202410769389.X

(51) Int. Cl.
*C10B 57/14* (2006.01)
*B01D 19/00* (2006.01)
(Continued)

(52) U.S. Cl.
CPC .......... *C10B 57/14* (2013.01); *B01D 19/0031* (2013.01); *B01D 53/18* (2013.01);
(Continued)

(58) Field of Classification Search
CPC ......... C10B 53/02; C10B 57/10; C10B 57/14; B01D 19/0031; B01D 53/18; B01D 53/229; B01J 6/008; C23C 16/26; C23C 16/448
See application file for complete search history.

(56) References Cited

U.S. PATENT DOCUMENTS 6,178,899 B1 * 1/2001 Kaneko ................... F23G 5/006 110/235
7,591,982 B2 * 9/2009 Guyomarc'h ............. F23G 7/04 422/232

(Continued)

*Primary Examiner* — Jonathan Miller
(74) *Attorney, Agent, or Firm* — Pilloff Passino & Cosenza LLP; Rachel K. Pilloff; Sean A. Passino

(57) ABSTRACT

A device for preparing carbon materials by pyrolysis and graded utilization of biomass includes a first tube furnace, a degassing mechanism and a second tube furnace. A first air inlet is in communication with an air outlet end of a first nitrogen bottle. A first air outlet of the first tube furnace is in communication with an air inlet end of the degassing mechanism, and the degassing mechanism is capable of absorbing water-soluble gas in pyrolysis gas. The second tube furnace has a second air inlet and a second air outlet, and the second air inlet is in communication with an air outlet end of the degassing mechanism, and the degassing mechanism is capable of sending water-insoluble gas in the pyrolysis gas into the second tube furnace and forming biochar by vapor deposition.

4 Claims, 4 Drawing Sheets

(51) Int. Cl.

| | |
|---|---|
| ***B01D 53/18*** | (2006.01) |
| ***B01D 53/22*** | (2006.01) |
| ***B01J 6/00*** | (2006.01) |
| ***C10B 53/02*** | (2006.01) |
| ***C10B 57/10*** | (2006.01) |
| ***C23C 16/26*** | (2006.01) |
| ***C23C 16/448*** | (2006.01) |

(52) U.S. Cl.

CPC ............ *B01D 53/229* (2013.01); *B01J 6/008* (2013.01); *C10B 53/02* (2013.01); *C10B 57/10* (2013.01); *C23C 16/26* (2013.01); *C23C 16/448* (2013.01); *B01D 2053/224* (2013.01); *B01D 2252/103* (2013.01)

(56) References Cited

U.S. PATENT DOCUMENTS

| | | | | |
|---|---|---|---|---|
| 9,216,916 | B2 * | 12/2015 | Traxler | C10G 2/32 |
| 10,844,302 | B2 * | 11/2020 | Rüdlinger | C10J 3/20 |
| 11,365,362 | B2 * | 6/2022 | Joly | C07C 7/10 |
| 11,702,602 | B2 * | 7/2023 | Joly | C10G 3/00<br>518/704 |
| 11,851,617 | B2 * | 12/2023 | Shah | C10B 47/24 |
| 2015/0167968 | A1 * | 6/2015 | Somogyi | F23G 7/003<br>110/346 |
| 2016/0045841 | A1 * | 2/2016 | Kaplan | B01D 3/06<br>429/49 |
| 2018/0066199 | A1 * | 3/2018 | Krylowicz | C01B 3/38 |
| 2021/0207033 | A1 * | 7/2021 | Shah | C10B 47/24 |

* cited by examiner

DEVICE AND METHOD FOR PREPARING CARBON MATERIALS BY PYROLYSIS AND GRADED UTILIZATION OF BIOMASS

CROSS-REFERENCE TO RELATED APPLICATIONS

This application is a continuation of PCT/CN2024/120662, filed Sep. 24, 2024and claims priority of Chinese Patent Application No. 202410769389.X, filed on Jun. 14, 2024, the entire contents of which are incorporated herein by reference.

TECHNICAL FIELD

The present disclosure relates to the technical field of biomass energy recycling, and in particular to a device and a method for preparing carbon materials by pyrolysis and graded utilization of biomass.

BACKGROUND

Biochar is a kind of charcoal as a soil improver, and is the product of pyrolysis of biomass (such as agricultural residues and forestry wastes) in anoxic or microaerobic environment, and the main component of biochar is carbon molecules. The main functions of biochar include aiding plants grow, purifying water quality and reducing the use of chemical fertilizers.

Pyrolysis gas will be produced in the process of biomass pyrolysis, and pyrolysis gas includes carbon dioxide ($CO_2$), carbon monoxide (CO), hydrogen ($H_2$), water vapor ($H_2O$), methane ($CH_4$), hydrogen sulfide ($H_2S$), ammonia ($NH_3$) and other gases. The amount of each gas component is affected by the type of raw materials, pyrolysis process and other conditions. If pyrolysis gas is directly discharged into the atmosphere, it will not only waste resources, but also affect air quality.

In view of this, how to provide a device that may reuse pyrolysis gas and reduce the impact on air quality is an urgent technical problem for those skilled in the art.

SUMMARY

An objective of the present disclosure is to provide a device and a method for preparing carbon materials by pyrolysis and graded utilization of biomass, in order to solve the problems existing in the prior art, to reuse pyrolysis gas, reduce the harmful gas content in pyrolysis gas, and enable the pyrolysis gas to meet the waste gas emission standard and be directly discharged into the atmosphere.

In order to achieve the above objectives, the present disclosure provides the following solution. The present disclosure provides a device for preparing carbon materials by pyrolysis and graded utilization of biomass, including:

- a first tube furnace, where the first tube furnace is internally placed with biomass raw materials, and has a first air inlet and a first air outlet, and the first air inlet is in communication with an air outlet end of a first nitrogen bottle;
- a degassing mechanism, where the first air outlet of the first tube furnace is in communication with an air inlet end of the degassing mechanism, and the degassing mechanism is capable of absorbing water-soluble gas in pyrolysis gas; and
- a second tube furnace, where the second tube furnace has a second air inlet and a second air outlet, the second air inlet is in communication with an air outlet end of the degassing mechanism, vapor deposition catalysts are placed in the second tube furnace, and the degassing mechanism is capable of sending water-insoluble gas in the pyrolysis gas into the second tube furnace and forming biochar by vapor deposition in the second tube furnace.

In an embodiment, a temperature of the first tube furnace is 450-600 °C, and a temperature of the second tube furnace is 700-900 °C In an embodiment, the degassing mechanism includes:

- a first degassing membrane, and the first degassing membrane is made of hollow fibers, an upper end of the first degassing membrane has a first water inlet, and a lower end has a first water outlet, an outer surface of the first degassing membrane is provided with a first gas flow channel, and two ends of the first gas flow channel are respectively in communication with the first air outlet and the second air inlet through first connecting ends;
- a water tank, and the first water outlet is in communication with the water tank; and
- a second degassing membrane, and the second degassing membrane is made of hollow fibers, an upper end of the second degassing membrane has a second water outlet, and a lower end has a second water inlet, an outer surface of the second degassing membrane is provided with a second gas flow channel, and the second gas flow channel is in communication with atmosphere; and the first water inlet is in communication with the second water outlet via a connecting pipeline, and the water tank is in communication with the second water inlet via the connecting pipeline, and a water pump is arranged on the connecting pipeline.

In an embodiment, two ends of the second gas flow channel are respectively in communication with a second nitrogen bottle and a vacuum pump through second connecting ends.

The present disclosure further provides a method for preparing carbon materials by pyrolysis and graded utilization of biomass, by using the device for preparing the carbon materials by the pyrolysis and the graded utilization of the biomass, including following steps:

- S1: preparing for pyrolysis: crushing and drying the biomass raw materials, and then placing into the first tube furnace, and placing the vapor deposition catalysts into the second tube furnace;
- S2: preheating: opening the first nitrogen bottle, and setting temperatures of the first tube furnace and the second tube furnace;
- S3: pyrolyzing: enabling the biomass raw materials to be pyrolyzed in the first tube furnace so as to form the biochar and generate the pyrolysis gas, starting the water pump to enable water in the water tank to circulate in the first degassing membrane, the second degassing membrane and the connecting pipeline so as to form circulating water;
- S4: reforming gas: enabling the pyrolysis gas to flow from the first tube furnace into the first gas flow channel, forming a positive pressure difference between the first gas flow channel and the first degassing membrane, enabling the water-soluble gas in the pyrolysis gas to pass through the hollow fibers of the first degassing membrane and dissolve into the circulating water; and enabling the circulating water with the water-soluble gas to flow into the second degassing membrane, forming a reverse pressure difference between the second degassing membrane and the second gas flow channel, enabling the water-soluble gas to pass through the hollow fibers of the second degassing membrane and enter the second gas flow channel, and discharging into the atmosphere along the second gas flow channel; and S5: performing vapor deposition: enabling the water-insoluble gas to flow into the second tube furnace, converting to form the biochar through the vapor deposition catalysts in the second tube furnace, and discharging waste gas, after the vapor deposition, into the atmosphere from the second air outlet.

The present disclosure provides the following technical effects.

1. According to the present disclosure, the pyrolysis gas generated by biomass pyrolysis may be reused, the water-insoluble gas in the pyrolysis gas may be separated, and the water-insoluble gas is converted into biochar by vapor deposition in the second tube furnace, so that the utilization rate of the pyrolysis gas is improved, the content of harmful gases in the pyrolysis gas is reduced, and the treated pyrolysis gas may be directly discharged into the atmosphere, which is green, environment-friendly and pollution-free.
2. The secondary utilization of pyrolysis gas may also improve the utilization rate of biomass raw materials and the yield of biochar.
3. The gas separation depends on the pressure difference between the gas channel and the degassing membrane, and there is no other energy consumption in the gas separation process except the kinetic energy of the water pump required for circulating water, which may reduce the treatment cost.

BRIEF DESCRIPTION OF THE DRAWINGS

In order to explain the embodiments of the present disclosure or the technical solution in the prior art more clearly, the drawings needed in the embodiments will be briefly introduced below. Apparently, the drawings in the following description are only some embodiments of the present disclosure. For one of ordinary skill in the art, other drawings may be obtained according to these drawings without creative effort.

DETAILED DESCRIPTION OF THE EMBODIMENTS

In the following, the technical solutions in the embodiments of the present disclosure will be clearly and completely described with reference to the attached drawings. Apparently, the described embodiments are only a part of the embodiments of the present disclosure, but not all the embodiments. Based on the embodiments in the present disclosure, all other embodiments obtained by one of ordinary skill in the art without creative effort belong to the protection scope of the present disclosure.

In order to make the above objects, features and advantages of the present disclosure more obvious and easier to understand, the present disclosure will be further described in detail with the attached drawings and specific embodiments.

Embodiment 1

Figure 1:
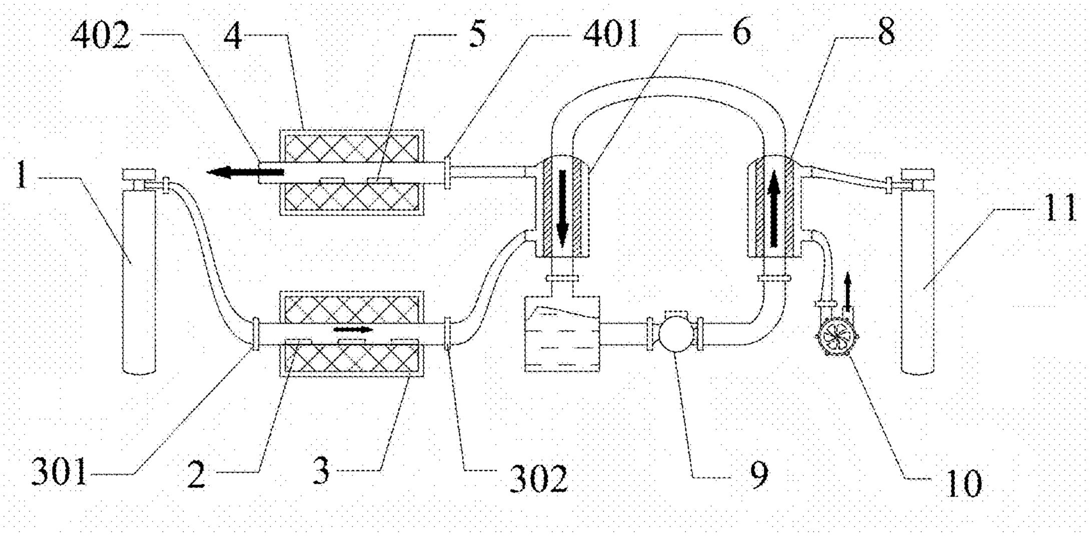
FIG. 1 is a schematic diagram of an overall structure of the present disclosure.

With reference to FIG. 1, an embodiment of the present disclosure provides a device for preparing carbon materials by pyrolysis and graded utilization of biomass, including: a first tube furnace 3, a degassing mechanism, and a second tube furnace 4.

The first tube furnace 3 is internally placed with biomass raw materials 2, and has a first air inlet 301 and a first air outlet 302, and the first air inlet 301 is in communication with the air outlet end of a first nitrogen bottle 1.

The first air outlet of the first tube furnace 3 is in communication with the air inlet end of the degassing mechanism, and the degassing mechanism is capable of absorbing water-soluble gas in pyrolysis gas.

The second tube furnace 4 has a second air inlet 401 and a second air outlet 402, and the second air inlet 401 is in communication with the air outlet end of the degassing mechanism, and vapor deposition catalysts 5 are placed in the second tube furnace 4, and the degassing mechanism is capable of sending the water-insoluble gas in pyrolysis gas into the second tube furnace 4 and forming biochar by vapor deposition in the second tube furnace 4.

Figure 2:
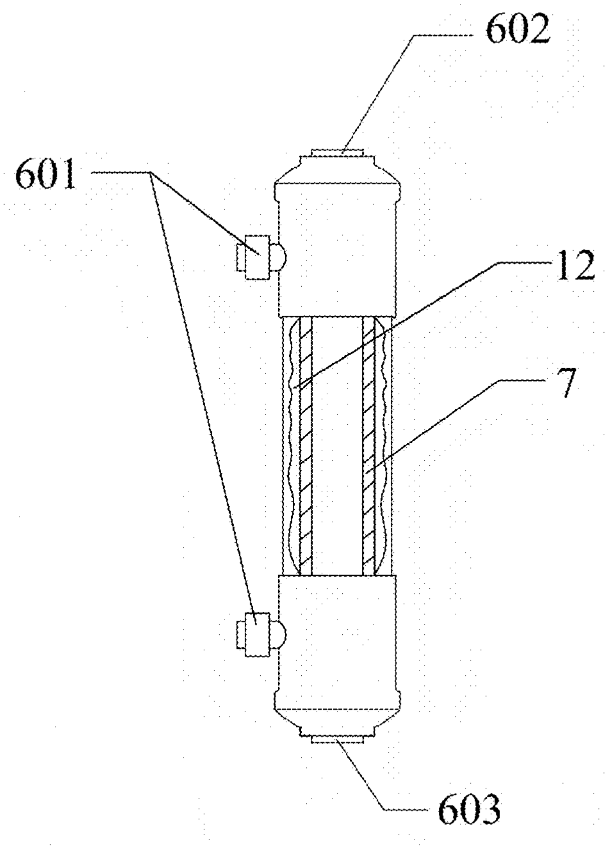
FIG. 2 is a schematic view of a first degassing membrane structure.
Figure 3:
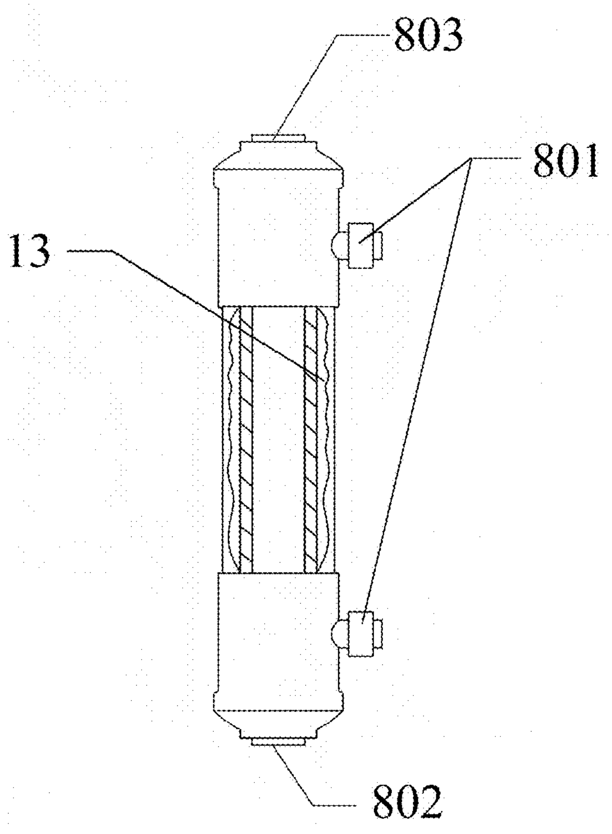
FIG. 3 is a schematic diagram of a second degassing membrane structure.

As shown in FIG. 2 and FIG. 3, the degassing mechanism includes: a first degassing membrane 6, a water tank, and a second degassing membrane 8.

The first degassing membrane 6 is made of hollow fibers, forming a hollow fiber layer 7 with an upper opening and a lower opening, and the upper end of the first degassing membrane 6 has a first water inlet 602 and the lower end has a first water outlet 603; the outer surface of the first degassing membrane 6 is provided with a first gas flow channel 12, and two ends of the first gas flow channel 12 are respectively in communication with the first air outlet 302 and the second air inlet 401 through first connecting ends 601.

The first water outlet 603 is in communication with the water tank.

The second degassing membrane 8 is made of hollow fibers, forming a hollow fiber layer 7 with an upper opening and a lower opening, and has the same structure as the first degassing membrane 6. The upper end of the second degassing membrane 8 has a second water outlet 803, and a lower end has a second water inlet 802; the outer surface of the second degassing membrane 8 is provided with a second gas flow channel 13, and two ends of the second gas flow channel 13 are respectively in communication with the second nitrogen bottle 11 and the vacuum pump 10 through second connecting ends 801; and a connecting pipeline is communicated between the first water inlet 602 and the second water outlet 803, and between the water tank and the second water inlet 802, and the water pump 9 is arranged on the connecting pipeline.

Figure 4:
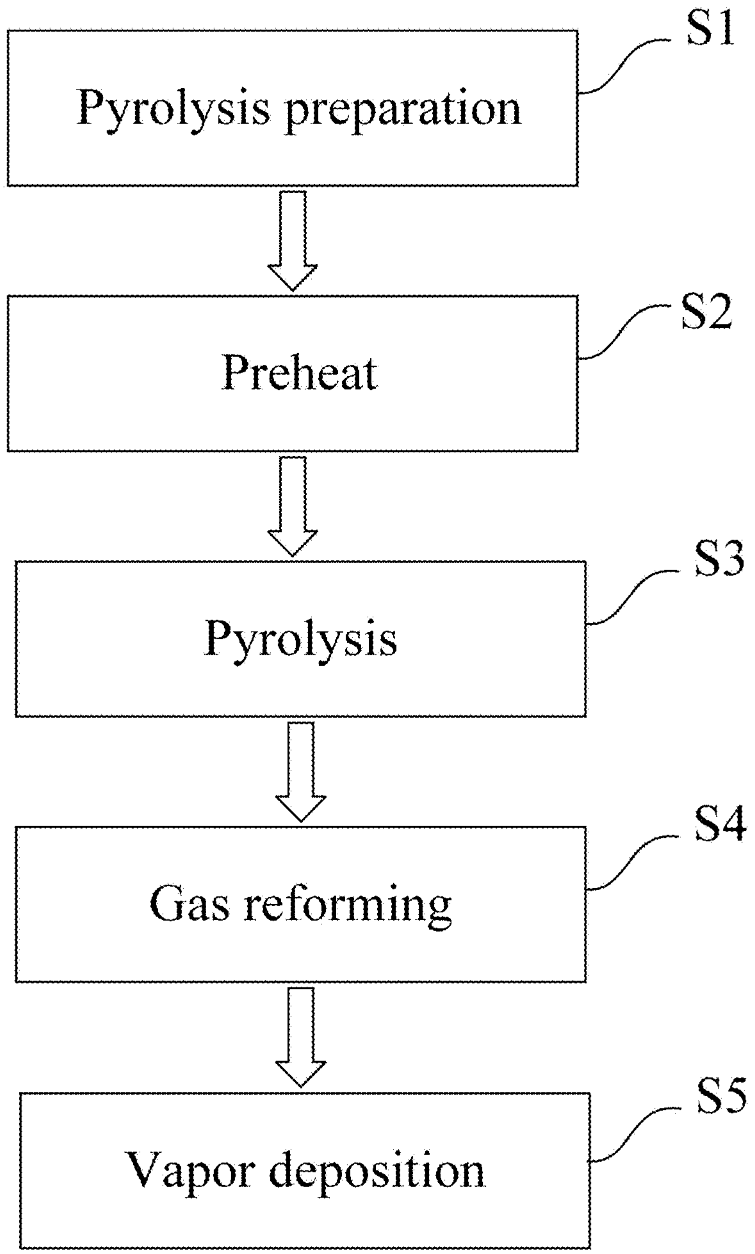
FIG. 4 is a flow chart of a method for preparing carbon materials by pyrolysis and graded utilization of biomass according to the present disclosure.

In combination with Embodiment 1, a method for preparing carbon materials by pyrolysis and graded utilization of biomass is described below, as shown in FIG. 4, including the following steps.

S1: pyrolysis preparation: biomass raw materials 2 (agricultural residue) are crushed and dried, and then put into the first tube furnace 3, and the vapor deposition catalysts 5 are put into the second tube furnace 4. Nickel is selected as the vapor deposition catalysts 5, in other embodiments, transition metals such as iron, cobalt and nickel may be selected.

S2: preheating: the first nitrogen bottle is opened, and the temperatures of the first tube furnace 3 and the second tube furnace 4 are set. The temperature of the first tube furnace 3 is 450 °C, and the temperature of the second tube furnace 4 is 700 °C

S3: pyrolysis: the biomass raw materials 2 are pyrolyzed in the first tube furnace 3 to form the biochar and generate the pyrolysis gas, and the pyrolysis gas includes carbon dioxide ($CO_2$), carbon monoxide (CO), hydrogen ($H_2$), water vapor ($H_2O$), methane ($CH_4$), hydrogen sulfide ($H_2S$) and ammonia ($NH_3$); at the same time, the water pump 9 is started to enable the water in the water tank to circulate in the first degassing membrane 6, the second degassing membrane 8 and the connecting pipeline, so as to form circulating water.

S4: gas reforming: the pyrolysis gas flows from the first tube furnace 3 into the first gas flow channel 12, and a positive pressure difference is formed between the first gas flow channel 12 and the first degassing membrane 6, and the water-soluble gas (including carbon dioxide ($CO_2$), water vapor ($H_2O$), hydrogen sulfide ($H_2S$) and ammonia ($NH_3$)) in the pyrolysis gas passes through the hollow fibers and dissolves into the circulating water. The circulating water carries water-soluble gas to flow into the second degassing membrane 8, and a reverse pressure difference is formed between the second degassing membrane 8 and the second gas flow channel 13; the water-soluble gas passes through the hollow fibers and enters the second gas flow channel 13, and is discharged into the atmosphere along the second gas flow channel 13.

S5: vapor deposition: water-insoluble gas (including carbon monoxide (CO), methane ($CH_4$) and a small amount of hydrogen ($H_2$)) flows into the second tube furnace 4, and is converted to form biochar through the vapor deposition catalysts 5 in the second tube furnace 4, and the waste gas, after the vapor deposition, is discharged into the atmosphere from the second air outlet 402.

The principle of positive pressure difference and reverse pressure difference in step S4 is as follows.

The positive pressure difference and the reverse pressure difference follow the gas law and Henry's law. The gas law is that the amount of dissolved gas is in direct proportion to the partial pressure in its gas phase, and this proportional factor is Henry's law constant $H_i$, Henry's law is expressed as follows:

$$C_i = \frac{P_i}{H_i} = \frac{P_T Y_i}{H_i}$$

where $P_i$ is a partial pressure of gas i in meteorology $H_i$ is a Henry's law constant of gas i $C_i$ is a concentration of gas i in water $P_T$ is a total pressure $Y_i$ is a proportion of gas i to total gas.

In other words, the gas will flow to the area containing less gas. Specifically, the positive pressure difference is formed between the first gas flow channel 12 and the first degassing membrane 6, because the first degassing membrane 6 contains circulating water and does not contain water-soluble gas in pyrolysis gas, the partial pressure of water-soluble gas in pyrolysis gas is greater than that of the first degassing membrane 6, and the water-soluble gas will pass through the hollow fiber layer 7 and dissolve into the circulating water. Similarly, the reverse pressure difference is formed between the second degassing membrane 8 and the second gas flow channel 13, one end of the second gas flow channel 13 is in communication with the second nitrogen bottle 11, and the other end is sucked to form a negative pressure via the vacuum pump 10, so the second gas flow channel 13 is filled with nitrogen and does not contain water-soluble gas. At this time, the partial pressure of water-soluble gas in circulating water is greater than that of the second degassing membrane 8, and the water-soluble gas will pass through the hollow fiber layer of the second degassing membrane and enter the second gas flow channel 13.

In step S5, the chemical vapor deposition occurs in the second tube furnace 4, and the main reactions are as follows:

$$CO \rightarrow C + O$$

$$CH_4 \rightarrow C + 2H_2$$

The reactions are carried out on the surfaces of the vapor deposition catalysts 5, where:

C: active carbon atoms will be adsorbed and diffuse on the surface of the vapor deposition catalyst 5, and finally form the required biochar structure.

O: oxygen atoms may react with the vapor deposition catalysts 5 to form nickel oxides or be removed by other reducing gases (such as $H_2$).

$H_2$ generated in this process is not only a by-product, but also plays an important regulating role with the existing $H_2$ in pyrolysis gas, which may help to control the deposition of carbon atoms on the vapor deposition catalyst 5 and prevent excessive aggregation, so as to control the structure and morphology of the growing carbon materials.

The gas discharged from the second air outlet 402 is collected, and the contents of carbon monoxide and methane in the gas are detected. The results show that in the discharged gas, the carbon monoxide content is 3%, the methane content is 1.2%, and the yield of biochar increases by 16%.

Embodiment 2

The difference between this embodiment and Embodiment 1 is that the temperature of the first tube furnace 3 is 600 °C and the temperature of the second tube furnace 4 is 900 °C. The gas discharged from the second air outlet 402 is collected, and the contents of carbon monoxide and methane in the gas are detected. The results show that in the discharged gas, the carbon monoxide content is 1.2%, the methane content is 0.6%, and the yield of biochar increases by 23%.

To sum up, after gas reforming and gas deposition, the pyrolysis gas in the present disclosure may reach the direct emission standard, avoid environmental pollution, improve the utilization rate of pyrolysis gas and biomass raw material 2, and reduce energy consumption.

In the description of the present disclosure, it should be understood that the terms "longitudinal", "transverse", "up", "down", "front", "back", "left", "right", "vertical", "horizontal", "top", "bottom", "inside", "outside", etc. indicate orientation or positional relationships based on the orientation or positional relationships shown in the accompanying drawings, only for the convenience of describing the present disclosure, and do not indicate or imply that the device or element referred to must have a specific orientation, be constructed and operated in a specific orientation, and therefore cannot be understood as a limitation of the present disclosure.

The above-mentioned embodiments only describe the preferred mode of the present disclosure, and do not limit the scope of the present disclosure. Under the premise of not departing from the design spirit of the present disclosure, various modifications and improvements made by one of ordinary skill in the art to the technical solution of the present disclosure should fall within the protection scope of the present disclosure.

What is claimed is:

1. A device for preparing carbon materials by pyrolysis and graded utilization of biomass, comprising:

a first tube furnace, wherein the first tube furnace comprises biomass raw materials internally placed therein, and has a first air inlet and a first air outlet, and the first air inlet is in communication with an air outlet end of a first nitrogen bottle;

a degassing mechanism, wherein the first air outlet of the first tube furnace is in communication with an air inlet end of the degassing mechanism, and the degassing mechanism is capable of absorbing water-soluble gas in pyrolysis gas; and a second tube furnace, wherein the second tube furnace has a second air inlet and a second air outlet, the second air inlet is in communication with an air outlet end of the degassing mechanism, vapor deposition catalysts are placed in the second tube furnace, and the degassing mechanism is capable of sending water-insoluble gas in the pyrolysis gas into the second tube furnace and forming biochar by vapor deposition in the second tube furnace, wherein the degassing mechanism comprises:

a first degassing membrane, wherein the first degassing membrane is made of hollow fibers, an upper end of the first degassing membrane has a first water inlet, and a lower end of the first degassing membrane has a first water outlet; an outer surface of the first degassing membrane is provided with a first gas flow channel, and two ends of the first gas flow channel are respectively in communication with the first air outlet and the second air inlet through first connecting ends;

a water tank in communication with the first water outlet; and a second degassing membrane, wherein the second degassing membrane is made of hollow fibers, an upper end of the second degassing membrane has a second water outlet, and a lower end of the second degassing membrane has a second water inlet; an outer surface of the second degassing membrane is provided with a second gas flow channel, and the second gas flow channel is in communication with atmosphere; and the first water inlet is in communication with the second water outlet via a connecting pipeline, the water tank is in communication with the second water inlet via the connecting pipeline, and a water pump is arranged on the connecting pipeline.

2. The device according to claim 1, wherein a temperature of the first tube furnace is 450-600 °C, and a temperature of the second tube furnace is 700-900 °C.

3. The device according to claim 1, wherein two ends of the second gas flow channel are respectively in communication with a second nitrogen bottle and a vacuum pump through second connecting ends.

4. A method for preparing carbon materials by pyrolysis and graded utilization of biomass, using the device according to claim 1, comprising following steps:

S1: preparing for pyrolysis: crushing and drying the biomass raw materials, and then placing into the first tube furnace, and placing the vapor deposition catalysts into the second tube furnace;

S2: preheating: opening the first nitrogen bottle, and setting temperatures of the first tube furnace and the second tube furnace;

S3: pyrolyzing: enabling the biomass raw materials to be pyrolyzed in the first tube furnace so as to form the biochar and generate the pyrolysis gas, and starting the water pump to enable water in the water tank to circulate in the first degassing membrane, the second degassing membrane and the connecting pipeline so as to form circulating water;

S4: reforming gas: enabling the pyrolysis gas to flow from the first tube furnace into the first gas flow channel, forming a positive pressure difference between the first gas flow channel and the first degassing membrane, enabling the water-soluble gas in the pyrolysis gas to pass through the hollow fibers of the first degassing membrane and dissolve into the circulating water; and enabling the circulating water with the water-soluble gas to flow into the second degassing membrane, forming a reverse pressure difference between the second degassing membrane and the second gas flow channel, enabling the water-soluble gas to pass through the hollow fibers of the second degassing membrane and enter the second gas flow channel, and discharging into the atmosphere along the second gas flow channel; and S5: performing vapor deposition: enabling the water-insoluble gas to flow into the second tube furnace, converting to form the biochar through the vapor deposition catalysts in the second tube furnace, and discharging waste gas, after the vapor deposition, into the atmosphere from the second air outlet.

* * * * *